United States Patent [19]

Mantese et al.

[11] Patent Number: 4,918,051
[45] Date of Patent: Apr. 17, 1990

[54] METALORGANIC DEPOSITION OF SUPERCONDUCTING $E_u$-$B_a$-$C_u$O THIN FILMS BY RAPID THERMAL ANNEALING

[75] Inventors: Joseph V. Mantese, Washington; Adolph L. Micheli, Mt. Clemens; Aboud H. Hamdi, Detroit, all of Mich.

[73] Assignee: General Motors Corporation, Detroit, Mich.

[21] Appl. No.: 136,577

[22] Filed: Dec. 22, 1987

Related U.S. Application Data

[63] Continuation-in-part of Ser. No. 103,245, Sep. 30, 1987, abandoned.

[51] Int. Cl.$^4$ .............................................. B05D 3/02
[52] U.S. Cl. ......................................... 505/1; 427/62; 427/63; 427/126.3; 427/226
[58] Field of Search ............... 427/62, 63, 53.1, 126.3, 427/226; 505/1, 818, 819

[56] References Cited

U.S. PATENT DOCUMENTS

| | | | |
|---|---|---|---|
| 4,239,816 | 12/1980 | Breininger et al. | 427/168 |
| 4,292,347 | 9/1981 | Donley | 427/110 |
| 4,316,785 | 2/1982 | Suzuki et al. | 427/63 |
| 4,395,436 | 7/1983 | Bianchi et al. | 427/53.1 |
| 4,485,094 | 11/1984 | Pebler et al. | 427/126.3 |
| 4,507,643 | 3/1985 | Sunano et al. | 330/34 |

OTHER PUBLICATIONS

Gurvitch et al, "Preparation and Substrate Reactions of Superconducting Y-Ba-Cu-O Films", Appl. Phys. Lett., 51(B), Sep. 1987, pp. 1027-1029.

Lee et al, "Microprobe Characterization of Sputtered High Tc Superconducting Films on Silicon", AIP, No. 165, Nov. 1987, pp. 427-434.

Vest et al, "Synthesis of Metallo-Organic Compounds for MOD Powders and Films", MRS (Boston, MA), Dec. 2, 1985.

Venkatesan, "Laser Deposited High Tc Superconducting Thin Films", Solid State Technology, Dec. 1987, pp. 39-41.

Koinuma et al, "Some Problems in the Preparation of Superconducting Oxide Films on Ceramic Substrates", Jpn. J. Appl. Phys., 26(5), May 1987, L763-765.

M. E. Gross et al, "Versatile New Metalorganic Process for Preparing Superconducting Thin Films," Applied Physics Letters, vol. 52, No. 2, Jan. 11, 1988, pp. 160-162.

C. E. Rice et al, "Preparation of Superconducting Thin Films of $Ba_2YCu_3O_7$ by a Novel Spin-On Prolysis Technique," Applied Physics Letters, vol. 51, No. 22, Nov. 30, 1987, pp. 1842-1844.

D. K. Lathrop et al, "Production of $YBa_2Cu_3O_{7-y}$ Superconducting Thin Films in situ by High Pressure Reactive Evaporation and Rapid Thermal Annealing," Applied Physics Letters, vol. 51, No. 19, Nov. 9, 1987, pp. 1554-1556.

M. K. Wu et al., "Superconductivity at 93K in a New Mixed-Phase Y-Ba-Cu-O Compound System at Ambient Pressure," Physical Review Letters, vol. 58, No. 9, Mar. 2, 1987, pp. 908-910.

H. Adachi et al, "Preparation and Characterization of Superconducting Y-Ba-Cu-O Thin Film," Japanese Journal of Applied Physics, vol. 26, No. 5, May 1987, pp. L709-L710.

D. Dijkkamp and T. Venkatesan, "Preparation of Y-Ba-Cu Oxide Superconductor Thin Films Using Pulsed Laser Evaporation from High T Bulk Material," Applied Physics Letters, vol. 51, No. 8, Aug. 24, 1987, pp. 619-621.

P. H. Hor et al, "Superconductivity Above 90K in the Square-Planar Compound System $ABa_2Cu_3O_{6+x}$ with A=Y, La, Nd, Sm, Eu, Gd, Ho, Er, and Lu," Physical Review Letters, vol. 58, No. 18, 4 May 1987, pp. 1891-1894.

D. W. Murphy et al, "New Superconducting Cuprate Perovskites," Physical Review Letters, vol. 58, No. 18, 4 May 1987, pp. 1888-1890.

Primary Examiner—Norman Morgenstern
Assistant Examiner—Roy V. King
Attorney, Agent, or Firm—Robert J. Wallace

[57] ABSTRACT

Superconducting thin films of $YBa_2Cu_4O_2$, having a superconducting transition temperature of 90° K., are produced in a non-vacuum environment using Mettalo-Organic Deposition techniques. An ink comprising the neodecanoates of yttrium, barium, and copper is formed and spun on a single crystal substrate of strontium titanate. The ink is dried in an air environment, heated in an air environment at a temperature sufficient to decompose the neodecanoates, about 500° C., and then heated again to promote recrystallization and grain growth of the remaining metal oxides. The resulting thin film exhibits superconductive characteristics at about 90° K.

3 Claims, No Drawings

METALORGANIC DEPOSITION OF SUPERCONDUCTING $E_u$-$B_a$-$C_u$O THIN FILMS BY RAPID THERMAL ANNEALING

This application is related to the copending U.S. Patent applications, entitled "Ytterbium, Barium, Copper Oxide Film Superconductors", Ser. No. 136,585 filed Dec. 22, 1987 and incorporated herein by reference, and "Formation of Film Superconductors by Metallo-Organic Deposition", Ser. No. 186,627 filed Apr. 27, 1988 and incorporated herein by reference. The latter U.S. Patent application is a continuation-in-part application of Ser. No. 103,245, filed Sept. 30, 1987, now abandoned.

This invention relates to superconductors and methods of making films of superconductor materials.

BACKGROUND OF THE INVENTION

Since the first report of a superconductor material having a superconducting transition temperature of about 40K, there has been extensive activity in the field to develop materials having an even higher range of superconducting transition temperatures. A wide variety of superconductor materials having high transition temperatures have been reported, including superconducting materials comprising yttrium, barium, and copper which have transition temperatures greater than about 80K. Thin film superconductors based upon these yttrium, barium, and copper compounds have been prepared by sputtering, E-beam and laser evaporation, all techniques requiring vacuum processing. As new materials with ever increasing transition temperatures are sought and developed, it is desirable to have a means for preparing thin films of these superconducting materials which uses non-vacuum techniques, permits easy alteration of chemical components, and is compatible with other film processing techniques.

Metallo-Organic Deposition (MOD) is an entirely nonvacuum method of film deposition. Typically, a liquid solution of organic compounds is prepared by dissolution of the organic compounds in a suitable solvent. This solution is then applied much in the same manner as photo-resist, as by spin coating the organic solution onto a selected substrate material. The soft metallo-organic film is then heated in air or oxygen to burn out the organic components and produce a thin film. By utilizing non-vacuum processing techniques, the Metallo-Organic Deposition method provides an economical means for film preparation of semiconductor materials. In addition, the ease in which compounds of a variety of elements can be made allows a wide range of multi-metal compounds to be prepared.

SUMMARY OF THE INVENTION

It is an of the present invention to provide superconductor films, particularly to provide a superconducting film comprising the rare earth metal europium.

It is a further object of this invention to provide a method for forming films of superconductor materials.

It is still a further object of this invention that these superconductor films be formed in a non-vacuum, oxygen-containing environment.

In accordance with a preferred embodiment of this invention, these and other objects and advantages are accomplished as follows.

We have prepared for the first time thin film superconductors in a non-vacuum, oxygen-containing environment using metallo-organic deposition techniques. Superconducting thin films, comprising barium, copper, and a rare earth (RE) metal, were formed on single crystal strontium titanate substrates by the thermal decomposition of an ink forming solution of the neodecanoates of the barium, copper, and rare earth metal. The preferred rare earth metals include yttrium, ytterbium, and europium.

As an illustrative example, europium comprising superconducting films, having the approximate empirical formula $Eu_1Ba_2Cu_4O_z$, are formed in the following manner. An ink forming solution contains the neodecanoates of the europium, barium, and copper and is combined with an appropriate solvent. Preferably, about 1 gram of the combined metal neodecanoates is added to about 1 milliliter of solvent. An ink of the preferred composition was spun onto the strontium titanate substrate at about 2000 revolutions per minute. The spun on ink was dried in air at about 110° C. for about five minutes, then immediately placed into a furnace preheated to about 500° C. and baked in air at this temperature for about five minutes so as to decompose the metal neodecanoates leaving only a metal oxide film on the substrate surface. It is preferred that the prepared metallo-organic inks not set at ambient conditions too long. The amounts of metal remaining on the substrate surface after baking reliably correspond to the amount of metals within the original metallo-organic ink. The film was then rapid thermal annealed at about 930° C. in an oxygen-containing atmosphere for an amount of time ranging between instantaneously up to about 2 minutes, and subsequently rapidly quenched to room temperature.

Rutherford Backscattering Spectrometry was used to determine that the resulting film's empirical composition prepared in accordance with this method was $Eu_1Ba_2Cu_4O_z$. It is believed that z ranges between about 6–8, as this is the relative composition in which superconducting characteristics are observed. This method may be employed to produce superconducting films of the rare earth (RE) metals having a general empirical composition of approximately $RE_1Ba_2Cu_4O_z$, wherein the rare earth metal is chosen from the group consisting of yttrium, ytterbium, europium, or a yttrium/europium combination.

A superconducting film prepared in accordance with this method, comprising europium and having an approximate empirical composition $Eu_1Ba_2Cu_4O_z$, exhibited a zero state resistance temperature of about 20K and a superconducting transition temperature of about 70K. Electrical measurements show a zero state resistance temperature of about 70K for a superconducting film of $Y_1Ba_2Cu_4O_z$, prepared in accordance with this method and a superconducting transition temperature of about 90K. A superconducting film prepared in accordance with this method, comprising ytterbium and having an approximate empirical composition $Yb_1Ba_2Cu_4O_z$, is characterized by a zero state resistance temperature of about 84K and a superconducting transition temperature of about 90° K.

Suitable superconducting results have also been obtained by baking the thin films for about six hours at about 850° C., and slow cooling the materials to room temperature, rather than the short duration rapid thermal annealing and quenching steps. The inventors are the first to employ non-vacuum techniques and achieve thin film superconductors.

Other objects and advantages of this invention will be better appreciated from a detailed description thereof, which follows.

DETAILED DESCRIPTION OF THE INVENTION

The inventors are the first to achieve thin film superconductors using an entirely non-vacuum method. In the present invention, metallo-organic inks are prepared using carboxylates of a rare earth (RE) metal, barium, and copper. The preferred carboxylates are the neodecanoates of the various metals. The preferred rare earth metals are yttrium, ytterbium, and europium. Rutherford Backscattering Spectrometry analysis was used to determine film composition and thickness. Using this technique, the composition of the inks may be adjusted to obtain desired superconducting compositions.

The Rutherford Backscattering Spectrometry analysis revealed that the relative metal compositions of the preferred thin films were approximately $RE_1Ba_2Cu_4O_z$, and the rare earth (RE) metal comprising yttrium, ytterbium, europium, or a ytterbium/europium combination. Using Rutherford Backscattering Spectrometry, the relative compositions for the ytterbium comprising films and the europium comprising films could were not determined precisely, since the relatively heavy atomic weight of ytterbium and europium prevented the accurate detection of these metals, as the heavy metals were not entirely distinguishable from the barium in the composition. In addition, the concentration of oxygen in the thin films could not be determined precisely from the Rutherford Backscattering Spectrometry spectrum because the oxygen signal from the sapphire substrate on which the thin film coatings were formed overlapped that of the oxygen signal from the superconducting thin films. It is believed that in the empirical formula $RE_1Ba_2Cu_4O_z$, z ranges between about 6 to about 8.

The usual solvent for the metal neodecanoates is xylene, however it was observed that the yttrium, ytterbium, and europium neodecanoates gel in xylene forming an unusable ink. It was found that the addition of approximately about 5 to about 10 percent pyridine by volume to the xylene forms a solvent that will not gel these neodecanoates. In addition, it was observed that the addition of the pyridine in two separate steps forms superior metallo-organic inks. First, the barium, copper, and rare earth neodecanoates are dissolved by stirring the neodecanoates in a 95% xylene and 5% pyridine solvent for approximately ten hours at room temperature. An additional amount of pyridine, about 1 to about 5 percent, is subsequently added to the metallo-organic ink after the first stirring step and the ink is further stirred for approximately one hour. Forming a solution of the metal neodecanoates ensures intimate mixing of the elements that will ultimately form the superconducting compound.

Inks prepared using this method are spun on smooth strontium titanate substrates and then fired to decompose the neodecanoates within the metallo-organic ink. The method of firing the ink onto the substrate is critical, in that thermogravimetric analysis shows that the metal neodecanoates of the rare earth metal, the copper and the barium volatilize and decompose at different temperatures. It was determined that the freshly prepared metallo-organic inks, which have been spun onto the substrates, should be rapidly placed in a furnace preheated to about 500° C. It is preferred that the prepared inks do not set at ambient conditions for too long. This will result in quality inks for purposes of preparing thin films of the superconducting composition. After the firing step an oxide film of the appropriate metal oxide composition remains on the substrate, the proportion of the metal corresponding reliably to the amount of metal in the inks. Using this method, the composition of the metallo-organic inks may be adjusted to obtain various compositions in the oxide films.

The ink is carefully poured onto the top surface of a stationary strontium titanate substrate, so as to flood the surface. The substrates are about one centimeter square by about 0.15 centimeter height, oriented in the <100> crystal direction. The viscous metallo-organic inks are spun onto the substrate surface at various speeds. At 20 seconds at about 2000 revolutions per minute (RPM), the thickness of the ink after drying at about 85° C. so as to evaporate any solvent will be about 4.4 micrometers, and the thickness of the metal oxide film after heating to about 500° C. so as to decompose the neodecanoates will be about 2600 Angstroms. At 20 seconds at 3000 RPM the thickness after drying at 85° C. will be about 3.7 micrometers and the thickness after heating at about 500° C. will be about 2100 Angstroms. At about 20 seconds at 4000 RPM the corresponding thicknesses after drying at 85° C. and heating at 500° C. are about 3.1 micrometers and 2090 Angstroms. At about 20 seconds at 7000 RPM the corresponding thicknesses after drying at 85° C. and heating at 500° C. are about 2.6 micrometers and 1700 Angstroms. These measurements were determined using a step profile detector.

This two step sequence of first spinning the metallo-organic ink onto the substrate followed immediately by the firing at a temperature sufficient to decompose the metal neodecanoates, may be repeated so as to produce films having a thickness of up to about 2.0 micrometers. However, multiple deposition and firing sequences are not required though, as suitable results may be obtained with thicknesses as low as about 0.1 micrometers. These films may be processed, by employing multiple deposition techniques in accordance with this invention, to result in thicker or thinner films for optimal superconducting characteristics.

After repeating the spinning and firing sequence sufficiently so as to achieve the desired metal oxide thickness on the substrate, the films are then annealed in a non-vacuum oxygen containing environment at a sufficient temperature for a sufficient duration to promote recrystallization and grain growth within the metal oxides. The resulting films are characterized by superconductive electrical properties. It is preferred that the metal oxide films be rapid thermal annealed, i.e., exposed to the annealing temperature for a relatively short duration, from an instantaneous amount of time up to about 2 minutes. It has been determined that the use of rapid thermal annealing techniques produce superconducting films characterized by higher zero state resistance temperatures than the superconducting films which are conventionally annealed by baking at the desired temperature for a longer duration, i.e., about 6 hours.

Rapid thermal annealing techniques raise the temperature of the substrate and deposited film uniformly and almost instantaneously to the desired annealing temperature. Two methods are generally employed for rapid thermal annealing. The first method, which is the method we prefer, comprises heating the material using quartz lamps. The quartz lamps generate extremely large dosages of electromagnetic infrared radiation in the form of light. The substrates and films are heated very rapidly by exposing the substrates to the quartz lamps and electromagnetic radiation. The second method involves placing the substrates and films on a graphite receptacle and exposing the substrates to microwaves. The microwaves impinge the films deposited on the surface of the substrate and heat the film and substrate uniformly and quickly.

We are the first to produce superconducting thin films using entirely non-vacuum techniques.

Superconducting films comprising the rare earth metal, europium, and having an empirical composition of $Eu_1Ba_2Cu_4O_z$, were also produced using this metallo-organic deposition method. A metallo-organic ink was prepared using the neodecanoates of europium, barium, and copper. Metallo-organics of the europium and the barium neodecanoates were formed from their metal acetates by reaction with ammonium neodecanoate. The copper metallo-organic was formed by a reaction of copper (II) acetate with tetramethyl ammonium neodecanoate. The metal neodecanoates were dissolved in a solvent solution containing approximately 5 volume percent pyridine in xylene, and stirred for approximately 10 hours. An additional 1-5 volume percent pyridine was added to the solution stirred for about another hour. Solutions containing the europium, barium, and copper neodecanoates, of various concentrations, may be made by dissolving the three components in appropriate amounts of xylene and pyridine.

The europium comprising solution, i.e., ink, which resulted in the superconductor film composition of approximately $Eu_1Ba_2Cu_4O_z$, has a ratio of about one gram of the combined metal neodecanoates to about one milliliter of solvent. Approximately 14.65 grams of the ytterbium neodecanoate, 19.12 grams of the barium neodecanoate, and 13.76 grams of the copper neodecanoate, yielding a total of about 47.53 grams of metal neodecanoate, were dissolved in about 47.53 milliliters of solvent, the solvent comprising about 45.15 milliliters of xylene with about 2.38 milliliters of pyridine. The ink was stirred for approximately 10 hours at room temperature. Then, an additional 1 to 5 percent pyridine was added and stirring is continued for approximately another hour. The addition of the pyridine in a two steps followed by the stirring step is preferred and results in superior metallo-organic inks for purposes of forming the superconducting films. However, suitable results are obtained when the pyridine is added in a single step also. The viscous solutions having a viscosity of approximately 14 centipoise, were filtered, using Teflon membranes, to remove particles down to approximately 200 nanometers in size.

The inks prepared from the europium, barium, and copper neodecanoates and solvents were flooded onto single crystal strontium titanate, $SrTiO_3$, substrates of about one centimeter width by about one centimeter length by about 0.15 centimeter height, oriented in the <100> crystal direction. The inks were spun dry on the substrates at various speeds, about 2000 revolutions per minute for about 20 seconds, being preferred. The spun-on inks were dried in air at about 110° C. for about five minutes, then immediately placed in a furnace preheated to about 500° C. The thin film inks were heated in air at that temperature, 500° C., for about 5 minutes to decompose the europium, barium, and copper neodecanoates. This two step, spin-on and fire, deposition sequence was typically repeated multiple times to obtain a desired thickness between about 1.5 and 2.0 microns, however multiple depositions are not required.

Thermogravimetric analysis shows that complete decomposition of the combined europium, barium, and copper neodecanoates used in this invention occurs at about 450° C., leaving only the europium, barium, and copper oxides remaining on the strontium titanate substrate. The amount of metal remaining on the substrate surface reliably corresponds to the amount of metal in the initial metallo-organic inks. The inventors found that if the dried inks on the substrates are immediately placed in a furnace set at about 500° C., after the drying step at about 110° C., quality thin films of the superconducting composition are made for purposes of preparing the superconducting films. The grain sizes of the superconducting thin films prepared in accordance with this invention, using metallo-organic deposition techniques, are estimated to be about 250 nanometers in diameter.

After obtaining the desired thickness of the ink and completing the subsequent firing required to decompose the organic neodecanoates and leave only the metal oxides remaining on the substrate, the europium comprising samples were annealed in a non-vacuum, oxygen containing environment at atmospheric pressure to promote recrystallization and grain growth within the material. Preferably, the films were rapid thermal annealed using quartz lamps at about 930° C. in a pure oxygen atmosphere for an instantaneous amount of time up to about 2 minutes and rapidly quenched to room temperature. The resulting films of $Eu_1Ba_2Cu_4O_z$, prepared in accordance with this method exhibit superconductive characteristics.

For a $Eu_1Ba_2Cu_4O_z$ sample, as determined by Rutherford Backscattering Spectrometry, prepared in accordance with this metallo-organic deposition method and rapid thermal annealed in oxygen at a temperature of about 930° C. for about 45 seconds and quenched in air to room temperature, a zero point resistance temperature of about 20K was measured. The zero point resistance temperature was that temperature which corresponded to the resistivity limit set at $7.6 \times 10^{-8}$ ohms per centimeter. The room temperature resistivity was approximately $5.9 \times 10^{-3}$ ohms per centimeter. This material is further characterized by a superconducting transition temperature of about 70K, wherein a rapid drop in resistance was observed. Silver paint was used to make the four probe resistance measurements.

It is believed that the empirical composition for the superconducting europium comprising films is approximately $Eu_1Ba_2Cu_4O_z$, with z ranging between about 6-8. Rutherford Backscattering Analysis was employed to determine the empirical composition, however due to the weight of the europium, it was difficult to distinguish the europium from the barium during the analysis. This also occurred during the analysis of the ytterbium comprising superconducting material. It is believed that the superconducting characteristics of the europium comprising film may be optimized upon better analysis of the material.

It is preferred that the material be annealed at a temperature ranging between about 850° C. to about 1000° C. and for a duration of about an instantaneous amount of time up to about 2 minutes, with about 15 seconds to one minute being especially preferred. The duration and annealing temperature are inversely related; i.e., a shorter duration is required at a higher temperature. In addition, suitable results should be obtained using more conventional annealing techniques such as annealing at about 850° C. to about 1000° C. for a sufficient time to promote recrystallization and grain growth.

It is further believed that superconducting films comprising both europium and ytterbium having an empirical composition of $Eu_{0.5}Yb_{0.5}Ba_2Cu_4O_z$, with z ranging between about 6 to 8, may also be produced in accordance with this method for metallo-organic deposition and rapid thermal annealing. A metallo-organic ink comprising the appropriate amounts of the metal neodecanoates of europium, ytterbium, barium, and copper dissolved in the appropriate amounts of pyridine in xylene, would be spun-on to the appropriate substrate and fired at a temperature so as to decompose the organic neodecanoates. The substrate and film would then be annealed, preferably using rapid thermal annealing techniques, at the appropriate temperature to promote grain growth and recrystallization. It is believed that the resulting films would exhibit superconducting properties at elevated temperatures.

In addition, it is believed that superconducting films of lanthanum could also be produced in accordance with the method described above.

The inventors are the first to achieve thin film superconductors using an entirely non-vacuum process. With this invention, superconducting thin films of various compositions comprising a rare earth metal have also been formed on barium titanate and sapphire substrates. Other suitable temperature and diffusion resistant substrates may also be used. It is also believed that superconducting thin films may be formed, in accordance with this invention, on silicon or silicon oxide substrates if a suitable barrier layer, such as a strontium titanate layer, is provided between the substrate and metal neodecanoate inks.

This invention readily facilitates modification of the metal constituents and their ratios in the thin films, to obtain optimal superconducting characteristics within the thin films. This invention is also, an entirely non-vacuum process which is compatible with film processing techniques. While our invention has been described in terms of preferred embodiments it is apparent that other forms could be adopted by one skilled in the art without departing from the spirit of the invention, such as annealing the materials be exposing the materials to a focused laser beam or employing other appropriate materials. Accordingly the scope of our invention is to be limited only by the following claims.

We claim:

1. A method for producing films of superconductor materials comprising the steps of:

forming a solution from the neodecanoates of europium, barium, and copper metals, said metals form an oxide mixture exhibiting superconductive properties, said solution comprises a solvent having at least approximately 10 volume percent pyridine in xylene;

depositing a film of said solution onto a substrate, said substrate selected from the group consisting of strontium titanate, barium titanate, and sapphire;

pyrolyzing said film in an oxygen-containing environment at a first temperature of approximately 500° C. for up to approximately 5 minutes, so as to thermally decompose said neodecanoates of europium, barium and copper into a film containing oxides of europium, barium and copper, said pyrolyzing occurring substantially immediately after said depositing step; and heating said oxide film at a second temperature ranging between about 850° C. and 1000° C. for a duration of up to approximately 2 minutes to promote grain growth of said metal oxides within said film and induce a change therein by which said film exhibits superconducting properties at a significantly increased temperature.

2. A method for producing thin film superconductor materials comprising the steps of:

forming a solution from the neodecanoates of europium, barium, and copper metals, said metals form an oxide mixture exhibiting superconductive properties, said oxide mixture characterized by a ratio of approximately 1:2:4 for said europium, barium and copper metals respectively, said solution comprises a solvent having at least approximately 10 volume percent pyridine in xylene;

depositing a film of said solution onto a substrate, said substrate selected from the group consisting of strontium titanate, barium titanate, and sapphire;

pyrolyzing said film in an oxygen-containing environment at a first temperature of about 500° C. for about 5 minutes, so as to decompose said neodecanoates of europium, barium, and copper into a film containing oxides of europium, barium, and copper, said pyrolyzing occurring substantially immediately after said depositing step; and heating said metal oxide film at a second temperature of about 930° C. for a duration of approximately no more than 1 minute to promote grain growth of said metal oxides within said film and induce a change therein by which said film exhibits superconducting properties at a significantly increased temperature.

3. A method for producing films of superconductor materials as set forth in claim 2 wherein said resulting superconductive metal oxide film has a thickness ranging between about 0.1 microns to about 2.0 microns.

* * * * *